United States Patent [19]

Iizuka et al.

[11] Patent Number: 4,497,043

[45] Date of Patent: Jan. 29, 1985

[54] SEMICONDUCTOR MEMORY DEVICE

[75] Inventors: Tetsuya Iizuka, Kawasaki; Hisashi Hara, Kamakura, both of Japan

[73] Assignee: Tokyo Shibaura Denki Kabushiki Kaisha, Japan

[21] Appl. No.: 372,008

[22] Filed: Apr. 26, 1982

[30] Foreign Application Priority Data

May 25, 1981 [JP] Japan ................................ 56/78983

[51] Int. Cl.³ .............................................. G11C 11/40
[52] U.S. Cl. ....................................... 365/182; 365/230
[58] Field of Search ................. 365/182, 185, 189, 230

[56] References Cited

U.S. PATENT DOCUMENTS 4,228,527 10/1980 Gerber et al. ........................ 365/185

Primary Examiner—Terrell W. Fears
Attorney, Agent, or Firm—Finnegan, Henderson, Farabow, Garrett & Dunner

[57] ABSTRACT

A semiconductor memory device which comprises a memory section formed of a first substrate region of a first conductivity type and a first MOS transistor of a second conductivity type which is formed in the first substrate region to act as a transfer gate; and a peripheral circuit constituted by a second MOS transistor of a first conductivity type and a third MOS transistor of a second conductivity type. A second substrate region of a second conductivity type in which the second MOS transistor is formed substantially surrounds the memory section.

8 Claims, 7 Drawing Figures

SEMICONDUCTOR MEMORY DEVICE

BACKGROUND OF THE INVENTION

This invention relates to a dynamic semiconductor memory device.

Already known is a dynamic type semiconductor memory device using a MOS transistor and arranged as shown in FIG. 1. This conventional semiconductor memory device comprises a memory section A mounted on a P-type semiconductor substrate 10 biased to a negative potential $V_{BB}$ of, for example, $-2$ to $-3$ volts and a peripheral circuit B. A memory cell Q1 included in the memory section A comprises a transfer gate 18 formed of a gate electrode 12, gate insulation layer 14, and source or drain region 16; and a MOS capacitor 26 formed of a gate electrode 20, gate insulation layer 22 and inversion region 24. The peripheral circuit B consists of an N channel MOS transistor Q2 formed of a source region 28, a drain region 30 constructed by diffusing an N-type impurity at high concentration, and a gate electrode 34 mounted above the surface of the semiconductor substrate 10 with a thin insulation layer 32 interposed therebetween. With the conventional dynamic semiconductor memory device, data representing the presence or absence of an electron in the inversion region 24 is stored. However, this conventional memory device has the drawback that where a hot electron 36 released from the MOS transistor Q2 constituting the peripheral circuit B diffuses through the P-type semiconductor substrate 10 up to the memory cell Q1, then data stored in the inversion region 24 is disturbed.

The occurrence of such hot electron 36 tends to be prominent particularly in a densely integrated MOS field effect transistor. With a large-scale integrated semiconductor memory device, therefore, the generation of a hot electron presents a great problem.

SUMMARY OF THE INVENTION

It is accordingly the object of this invention to provide a semiconductor memory device which suppresses the disturbance of stored data resulting from a hot electron, and is elevated in the property of preserving stored data.

To attain the above-mentioned object, this invention provides a semiconductor memory device wherein a first substrate region of first conductivity type in which there is formed a memory section constituted by a first MOS transistor of second conductivity type which acts as a transfer gate is substantially surrounded by a second substrate region of second conductivity type in which a second MOS transistor constituting a peripheral circuit is formed. The above-mentioned arrangement can prevent a hot electron generated in the peripheral circuit from reaching a memory section.

BRIEF DESCRIPTION OF THE DRAWINGS

Other objects and advantages of this invention will become apparent from the following description taken in connection with the accompanying drawings, in which.

DETAILED DESCRIPTION OF THE PREFERRED EMBODIMENTS

Figure 1:
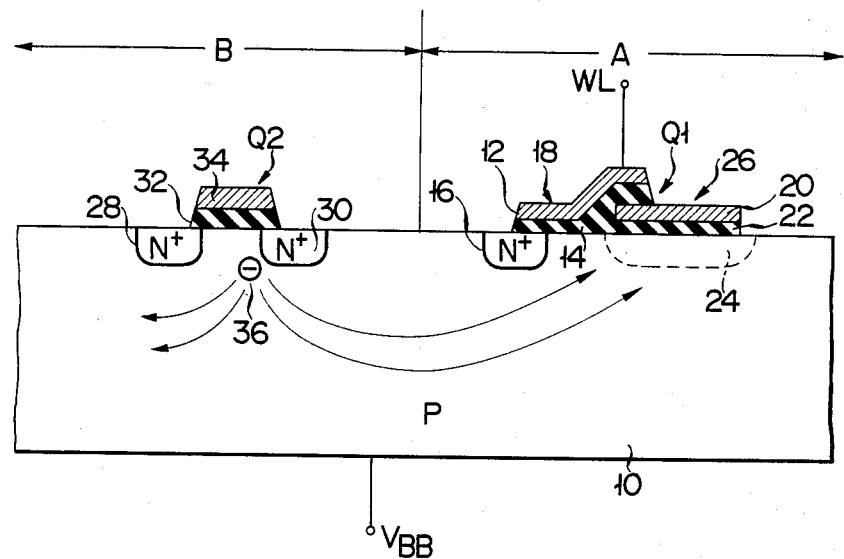
FIG. 1 is a schematic sectional view of the conventional semiconductor memory device.
Figure 2:
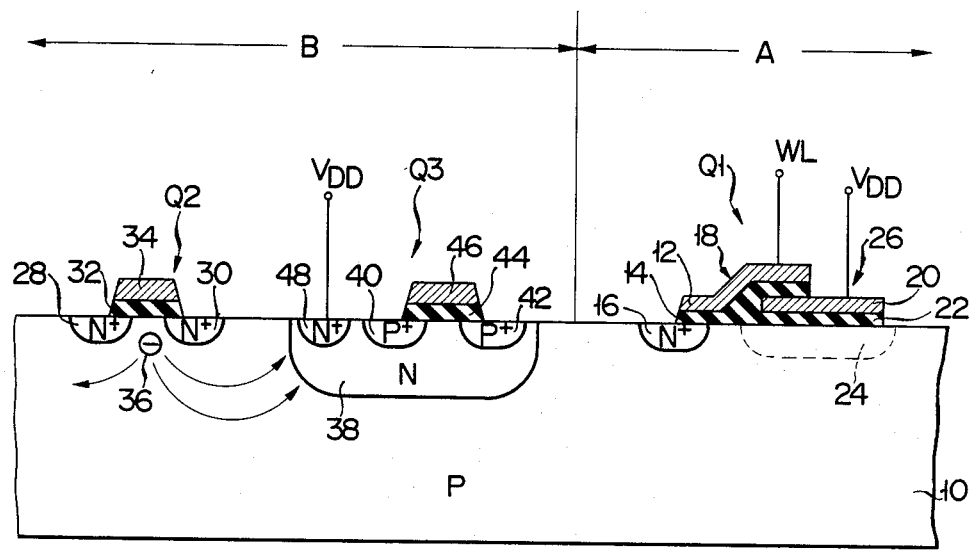
FIG. 2 is a sectional view of a semiconductor memory device according to a first embodiment of this invention.

Description is now given with reference to FIG. 2 of a semiconductor memory device according to a first embodiment of this invention. A memory section A and peripheral circuit B are mounted on a P-type semiconductor substrate 10. Each of the memory cells Q1 provided in the memory section A in the matrix form comprises a transfer gate 18 formed of a gate electrode 12 provided with a word line WL, gate insulation layer 14 and source-drain region 16, and a MOS capacitor 26 formed of a gate electrode 20 impressed with power source voltage $V_{DD}$, gate insulation layer 22 and inversion region 24.

The peripheral circuit B is a CMOS circuit comprised of an N channel MOS transistor Q2 and P channel MOS transistor Q3. The N channel MOS transistor Q2 comprises an N+ source region 28 and drain region 30 deposited on the surface of a P-type semiconductor substrate 10, and a gate electrode 34 set above the surface of the P-type semiconductor substrate 10 with a gate insulation layer 32 interposed therebetween. A P channel MOS transistor Q3 is formed within an N-type well region 38 diffused in the surface of the P-type semiconductor substrate 10 in a state substantially surrounding the memory section A. The P channel MOS transistor Q3 comprises a P+ source region 40 and a drain region 42 deposited on the surface of the N-type well region 38 and a gate electrode 46 set above the N-type well region 38 with a gate insulation layer 44 interposed therebetween. The N-type well region 38 is biased to a power source voltage $V_{DD}$ of, for example, 5 volts through a highly concentrated N-type impurity region 48.

With a semiconductor memory device according to a first embodiment of this invention which is arranged as described above, a hot electron 36 released from the N channel MOS transistor Q2 included in the peripheral circuit B is absorbed in the N-type well region 38 biased to high voltage. The hot electron 36 does not reach the memory section A surrounded by the N-type well region 38, thereby preventing data stored in the inversion region 24 from being disturbed.

High energy holes are likely to arise even in the P channel MOS field effect transistor Q3. However, their number is far smaller than that of hot electrons released from the N channel MOS transistor Q2. Moreover, since a carrier is formed of the holes, data stored in the inversion region 24 of the memory cell Q1 is little affected.

With the semiconductor memory device embodying this invention, the peripheral circuit B can be converted into a CMOS circuit, eliminating the necessity of applying a bootstrap circuit hitherto required to elevate a circuit operation speed. Therefore, the peripheral circuit B can be operated with a low voltage, thereby assuring the high reliability of a semiconductor memory device.

Figure 3:
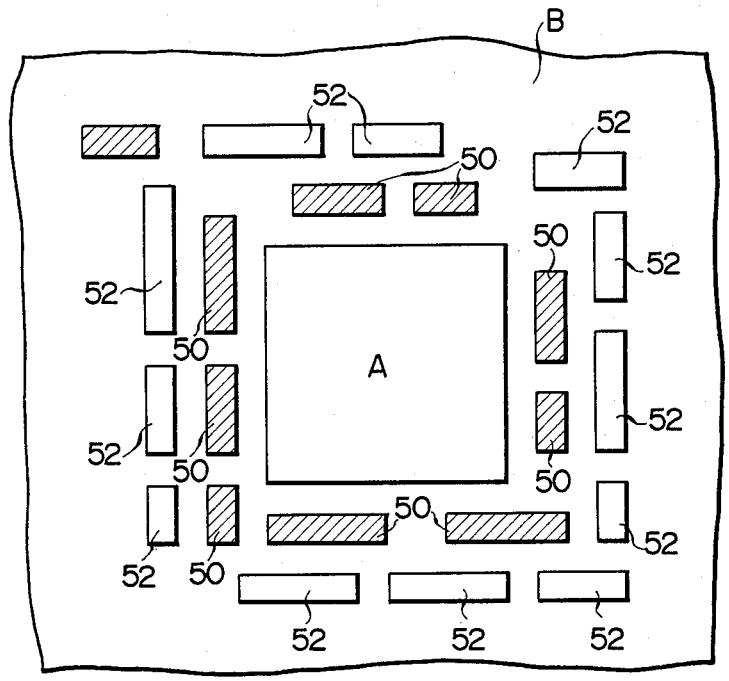
FIG. 3 is a plan view of the first embodiment of FIG. 2.
Figure 4:
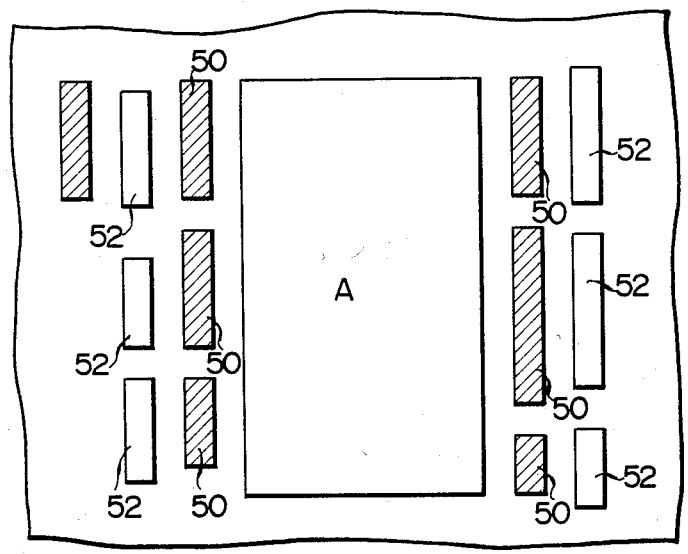
FIG. 4 is a plan view of a modification of the first embodiment of FIG. 2.

FIG. 3 is a schematic plan view of a semiconductor memory device according to a first embodiment of this invention. FIG. 4 is a schematic plan view of a modification of said first embodiment. In FIG. 3, a plurality of regions 50, in each of which the MOS transistor Q3 is provided are arranged around the memory section A. A plurality of regions 52, in each of which the MOS transistor Q2 is provided are set around the outside of a region defined by the plural regions 50.

In FIG. 4, a plurality of regions 50, in each of which the MOS transistor Q3 is provided, are arranged on both sides of the memory section A. A plurality of regions 52, in each of which the MOS transistor Q2 is provided are set outside of two rows of the regions 50. As seen from FIGS. 3 and 4, the memory section A need not be fully surrounded by the regions 50. The point is that a plurality of the regions 50 should be so arranged as to prevent a minority carrier generated in the regions 52 from being delivered to the memory section A.

Figure 5:
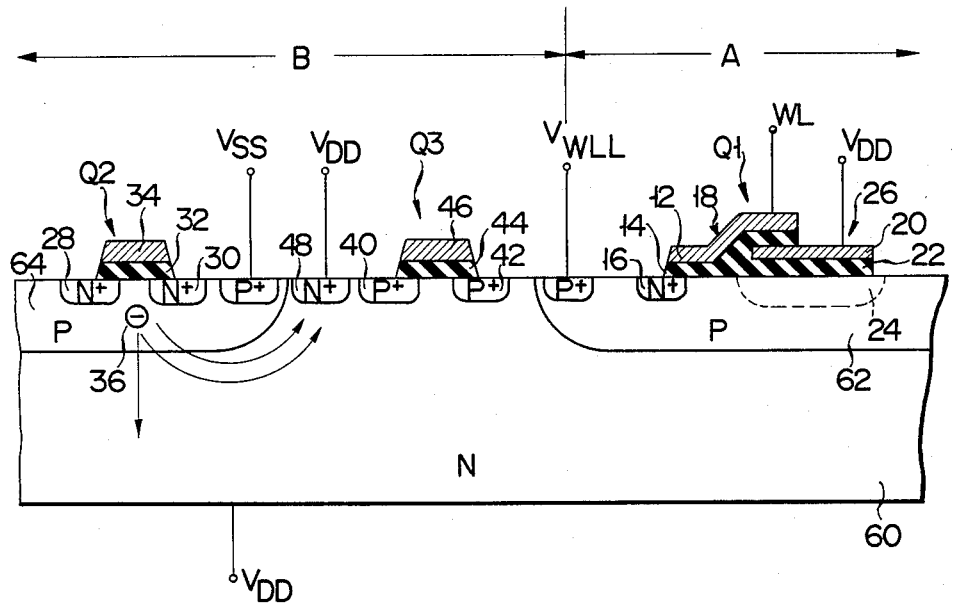
FIG. 5 is a sectional view of a semiconductor memory device according to a second embodiment of the invention.

Description is now given with reference to FIG. 5 of a semiconductor memory device according to a second embodiment of this invention. This semiconductor memory device is mounted on the surface of an N-type semiconductor substrate 60 biased to a power source voltage $V_{DD}$. Two independent P-type well regions 62, 64 are spatially formed on the surface of the semiconductor substrate 60. The memory section A is formed in the P-type well region 62 which is biased to a lower potential $V_{WLL}$ than the power source voltage VDD.

The P channel MOS transistor Q3 included in the peripheral circuit B is mounted on the surface of the N-type semiconductor substrate 60, which substantially surrounds the memory section A. The N channel MOS transistor Q2 included in the peripheral circuit B is formed in the P-type well region 64, which is biased to a reference voltage $V_{SS}$ of, for example, zero volt.

In other respects than described above, the second embodiment has substantially the same arrangement as the first embodiment. Therefore, the parts of the second embodiment the same as those of the first embodiment are denoted by the same reference numerals, description thereof being omitted.

In the second embodiment of FIG. 5, the P-type well region 62 is biased to a lower potential $V_{WLL}$ than the power source voltage $V_{DD}$. The N-type semiconductor substrate 10 is biased to the power source voltage $V_{DD}$, causing a PN junction formed between the N-type semiconductor substrate 10 and the P-type well region 62 to be reverse biased. Consequently a hot electron generated in the P-type well region 64 can be prevented from entering the P-type well region 62.

Figure 6:
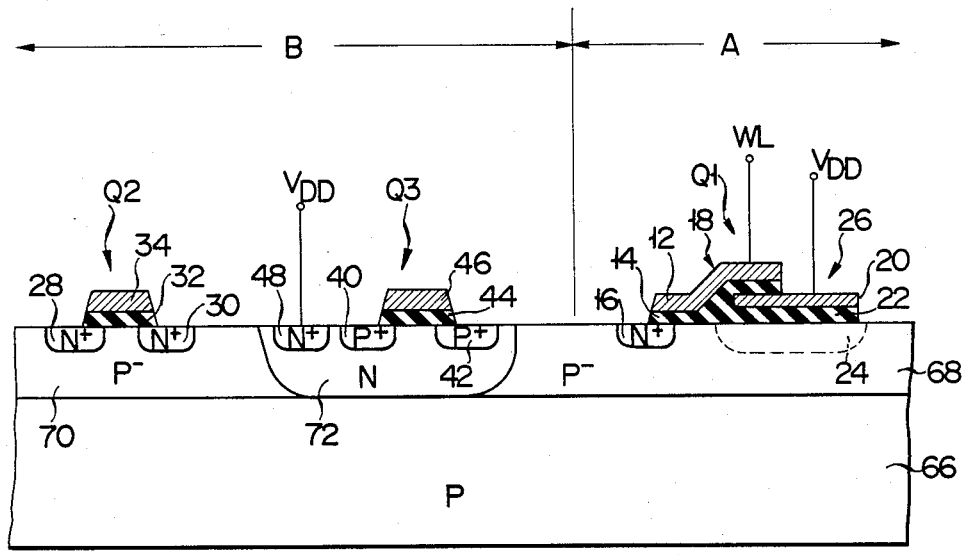
FIG. 6 is a sectional view of a semiconductor memory device according to a third embodiment of the invention.

Description is now given with reference to FIG. 6 of a semiconductor memory device according to a third embodiment. With this third embodiment, the memory section A is formed in a P-type layer 68 epitaxially grown on a P-type semiconductor substrate 66 at a low concentration of an impurity. An N channel MOS transistor Q2 included in the peripheral circuit B is formed in another similar epitaxially grown layer 70. The memory section A is substantially surrounded by an N-type well region 72 biased to the power source voltage $V_{DD}$. A P channel MOS transistor Q3 constituting the peripheral circuit B is formed in the N-type well region 72. The third embodiment has the same arrangement as the first embodiment in the other respects. Therefore, the parts of the third embodiment the same as those of the first embodiment are denoted by the same reference numerals, description thereof being omitted.

With the third embodiment of FIG. 6, a hot electron has a reduced lifetime, because an impurity is diffused in the P-type semiconductor substrate 66 at a high concentration, thereby elevating the effect of blocking a hot electron. A hot electron released from the MOS transistor Q2 has to pass through the semiconductor substrate 66 before the hot electron enters the memory section A. If, in this case, the semiconductor substrate 66 contains a high concentration of an impurity, there will be produced a larger number of holes. Therefore, a hot electron entering the semiconductor substrate 66 is again recombined with a hole, reduced in lifetime, and prevented from being brought into the inversion region 24.

Figure 7:
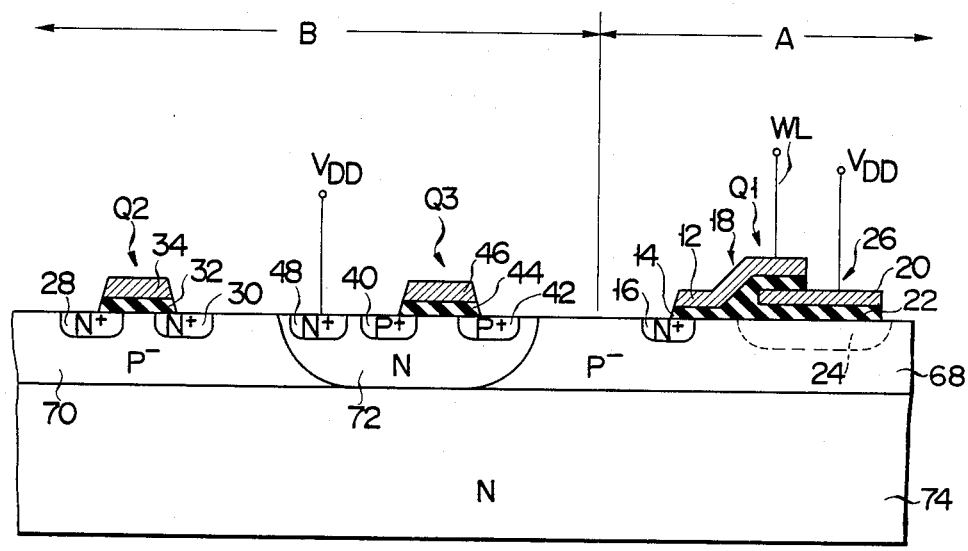
FIG. 7 is a sectional view of a modification of the third embodiment of FIG. 6.

Description is now given with reference to FIG. 7 of a modification of the third embodiment of FIG. 6. With this modification, circuit elements are formed in a P-type layer epitaxially grown on an N-type semiconductor substrate 74 instead of the P-type semiconductor substrate 66. The modification has the same arrangement as the third embodiment in other respects. Therefore, the parts of the modification the same as those of the third embodiment are denoted by the same reference numerals, description thereof being omitted.

What we claim is:

1. A semiconductor memory device comprising:
    a semiconductor body of a first conductivity type;
    first and second semiconductor regions of a second conductivity type formed in the surface of said semiconductor body;
    a memory section having at least one MOS transistor of a first channel type formed in the surface of said first semiconductor region and acting as a transfer gate; and
    a peripheral circuit including at least a second MOS transistor of a second channel type formed in the surface of said semiconductor body and a third MOS transistor of said first channel type formed in the surface of said second semiconductor region.

2. The semiconductor memory device according to claim 1, further including means for applying a voltage to said semiconductor body and said first semiconductor region wherein a PN junction defined by said semiconductor body and said first semiconductor region are reversed biased.

3. The semiconductor memory device according to claim 1, wherein said semiconductor body is formed of a semiconductor substrate and an epitaxially grown layer of said first conductivity type formed on the semiconductor substrate of said first conductivity type, and said first semiconductor region is a well region of said second conductivity type formed in said epitaxially grown layer.

4. The semiconductor memory device according to claim 3, wherein an impurity concentration in the semiconductor substrate is higher than an impurity concentration in said epitaxially grown layer.

5. The semiconductor memory device according to claim 3, wherein the well region of the second conductivity type contacts the semiconductor substrate, and the third MOS transistor is formed in an epitaxially grown layer of the first conductivity type substantially isolated from said second semiconductor region.

6. A semiconductor memory device comprising:
    a semiconductor body of a first conductivity type;

a memory section having at least one MOS transistor of a first channel type formed in the surface of said semiconductor body and acting as a transfer gate;

a semiconductor region of a second conductivity type formed in the surface of said semiconductor body substantially surrounding said memory section; and a peripheral circuit including at least one MOS transistor of a second channel type formed in the surface of said semiconductor region and at least one MOS transistor of said first channel type formed in the surface of said semiconductor body and outside said semiconductor region.

7. A semiconductor memory device comprising:

a semiconductor body of a first conductivity type;

first and second semiconductor regions of a second conductivity type separately formed in the surface of said semiconductor body;

a memory section having at least one MOS transistor of a first channel type formed in the surface of said first semiconductor region and acting as a transfer gate;

a peripheral circuit including at least one MOS transistor of said first channel type formed in the surface of said second semiconductor region; and a third semiconductor region of said first conductivity type formed in the surface of said semiconductor body surrounding said first semiconductor region and having a higher impurity concentration than said semiconductor body and a predetermined potential for absorbing minority carriers generated in said semiconductor body.

8. A semiconductor memory device comprising:

a semiconductor body of a first conductivity type;

a memory section having at least one MOS transistor of a first channel type formed in the surface of said semiconductor body and acting as a transfer gate;

a semiconductor region of a second conductivity type formed in the surface of said semiconductor body substantially surrounding said memory section and a potential for absorbing minority carriers generated in said semiconductor body; and a peripheral circuit including at least one MOS transistor of said first channel type formed in the surface of said semiconductor body and outside said semiconductor region.

* * * * *